United States Patent
Tanaka et al.

(10) Patent No.: US 11,081,705 B2
(45) Date of Patent: Aug. 3, 2021

(54) ALLOY MEMBER

(71) Applicant: NGK INSULATORS, LTD., Nagoya (JP)

(72) Inventors: Yuki Tanaka, Nagoya (JP); Toshiyuki Nakamura, Handa (JP); Makoto Ohmori, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 16/728,631

(22) Filed: Dec. 27, 2019

(65) Prior Publication Data

US 2020/0136154 A1 Apr. 30, 2020

Related U.S. Application Data

(63) Continuation of application No. PCT/JP2019/034576, filed on Sep. 3, 2019.

(30) Foreign Application Priority Data

Sep. 7, 2018 (JP) .............................. JP2018-168073
Oct. 18, 2018 (JP) .............................. JP2018-197004
Jan. 23, 2019 (JP) .............................. JP2019-009259

(51) Int. Cl.
*H01M 8/0245* (2016.01)
*C23C 14/02* (2006.01)
(Continued)

(52) U.S. Cl.
CPC ......... *H01M 8/0245* (2013.01); *C23C 14/028* (2013.01); *C23C 14/083* (2013.01);
(Continued)

(58) Field of Classification Search
CPC .................................................. H01M 8/0245
See application file for complete search history.

(56) References Cited

U.S. PATENT DOCUMENTS

| | | |
|---|---|---|
| 2011/0305972 A1 | 12/2011 | Kobayashi et al. |
| 2015/0155571 A1 | 6/2015 | Higashi |
| 2017/0237076 A1 | 8/2017 | Kozai et al. |

FOREIGN PATENT DOCUMENTS

| | | |
|---|---|---|
| JP | 2008081804 A | 4/2008 |
| JP | 2012023017 A | 2/2012 |

(Continued)

OTHER PUBLICATIONS

Kortright, K.; "Chemistry of Chromium", 2019, p. 1-5; https://chem.libretexts.org/Bookshelves/Inorganic_Chemistry/Modules_and_Websites_(Inorganic_Chemistry)/Descriptive_Chemistry/Elements_Organized_by_Block/3_d-Block_Elements/Group_06%3A_Transition_Metals/Chemistry_of_Chromium.*

(Continued)

*Primary Examiner* — Mark Ruthkosky
*Assistant Examiner* — Julia L Rummel
(74) *Attorney, Agent, or Firm* — Flynn Thiel, P.C.

(57) ABSTRACT

An alloy member includes a base member constituted by an alloy material containing chromium, a chromium oxide layer for covering at least a portion of a surface of the base member, a pore that is formed in an interface region of the base member that is located 30 μm or less from an interface between the chromium oxide layer and the base member, and an extending portion extending from the pore into the base member. The pore is configured to inhibit the separation of the chromium oxide layer from the base member The extending portion contains an oxide of an element whose equilibrium oxygen pressure is lower than that of a major element of the base member.

2 Claims, 5 Drawing Sheets

(51) Int. Cl.
*C23C 14/08* (2006.01)
*C23C 28/04* (2006.01)
*H01M 8/0232* (2016.01)
*H01M 8/0236* (2016.01)
*B32B 3/30* (2006.01)

(52) U.S. Cl.
CPC ......... *C23C 28/042* (2013.01); *H01M 8/0232* (2013.01); *H01M 8/0236* (2013.01); *B32B 3/30* (2013.01); *Y10T 428/249956* (2015.04)

(56) References Cited

FOREIGN PATENT DOCUMENTS

| | | | |
|---|---|---|---|
| JP | 6188181 B1 | 8/2017 | |
| JP | 6343728 B1 | 6/2018 | |
| JP | 6343729 B1 | 6/2018 | |
| JP | 6383003 B2 | 8/2018 | |
| JP | 6476341 B1 | 2/2019 | |
| WO | 2013/172451 A1 | 11/2013 | |

OTHER PUBLICATIONS

Heubner, U., "Nickel Alloys", 1998, Marcel Dekker Inc. p. 142.*
Japanese Office Action for corresponding application No. 2018-197004, dated Mar. 12, 2019, with machine translation thereof (19 pages).
Japanese Office Action for corresponding application No. 2019-009259, dated Mar. 12, 2019, with machine translation thereof (10 pages).
Japanese International Search Report and Written Opinion for corresponding PCT/JP2019/034576, dated Nov. 19, 2019 (9 pages).
U.S. Appl. No. 16/728,289, filed Dec. 27, 2019.
U.S. Appl. No. 16/728,352, filed Dec. 27, 2019.
English language International Search Report for corresponding PCT/JP2019/034576, dated Nov. 19, 2019 (2 pages).
English Translation of the International Preliminary Report on Patentability, issued in corresponding International Application No. PCT/JP2019/034576, dated Mar. 18, 2021 (7 pages).

* cited by examiner

ALLOY MEMBER

CROSS-REFERENCE TO RELATED APPLICATIONS

This application is a continuation application of PCT/JP2019/034576, filed Sep. 3, 2019, which claims priority to Japanese Application No. 2019-009259, filed Jan. 23, 2019, Japanese Application No. 2018-197004, filed Oct. 18, 2018, and Japanese Application No. 2018-168073, filed Sep. 7, 2018, the entire contents all of which are incorporated hereby by reference.

TECHNICAL FIELD

The present invention relates to an alloy member.

BACKGROUND ART

In a cell stack provided with fuel cells, which is one type of an electrochemical cell, conventionally, an alloy member has been used in a current collector member for collecting electrical current from the fuel cells, a separator for isolating the fuel cells, a manifold for supplying gas to the fuel cells, or the like (e.g., see Japanese Patent No. 6383003).

Usually, an alloy member includes a base member constituted by an alloy material containing chromium and a chromium oxide layer formed through the oxidation of the surface of the base member. The chromium oxide layer has a function of inhibiting chromium from vaporizing from the base member to the outside.

SUMMARY

When a chromium oxide layer separates from a base member, chromium is likely to vaporize from the base member to the outside, and thus there is a risk that the electrodes of the electrochemical cells will deteriorate through chromium poisoning.

Thus, there is a demand for inhibiting the separation of the chromium oxide layer from the base member.

An object of the present invention is to provide an alloy member capable of inhibiting the separation of the chromium oxide layer from the base member.

An alloy member according to the present invention is used in an electrochemical cell stack. The alloy member includes a base member constituted by an alloy material containing chromium, a chromium oxide layer for covering at least a portion of a surface of the base member, a pore that is formed in an interface region of the base member that is located 30 μm or less from an interface between the chromium oxide layer and the base member, and an extending portion extending from the pore into the base member. The pore is configured to inhibit separation of the chromium oxide layer from the base member. The extending portion contains an oxide of an element whose equilibrium oxygen pressure is lower than that of a major element of the base member.

According to the present invention, it is possible to provide an alloy member capable of inhibiting the separation of the chromium oxide layer from the base member.

DESCRIPTION OF EMBODIMENTS

1. First Embodiment

Configuration of Alloy Member 200

An alloy member 200 according to this embodiment is used in a stack in which at least two electrochemical cells are stacked (referred to as an "electrochemical cell stack" hereinafter). An "electrochemical cell" is a device for changing chemical energy into electric energy, or a device for changing electric energy into chemical energy, and is a generic term for a pair of electrodes disposed to generate an electromotive force from an overall redux reaction. Examples of the electrochemical cell include fuel cells in which protons serve as carriers, secondary cells (such as a nickel-zinc secondary battery and a zinc-air secondary battery), and electrolytic cells for generating hydrogen and oxygen from water vapor.

Figure 1:
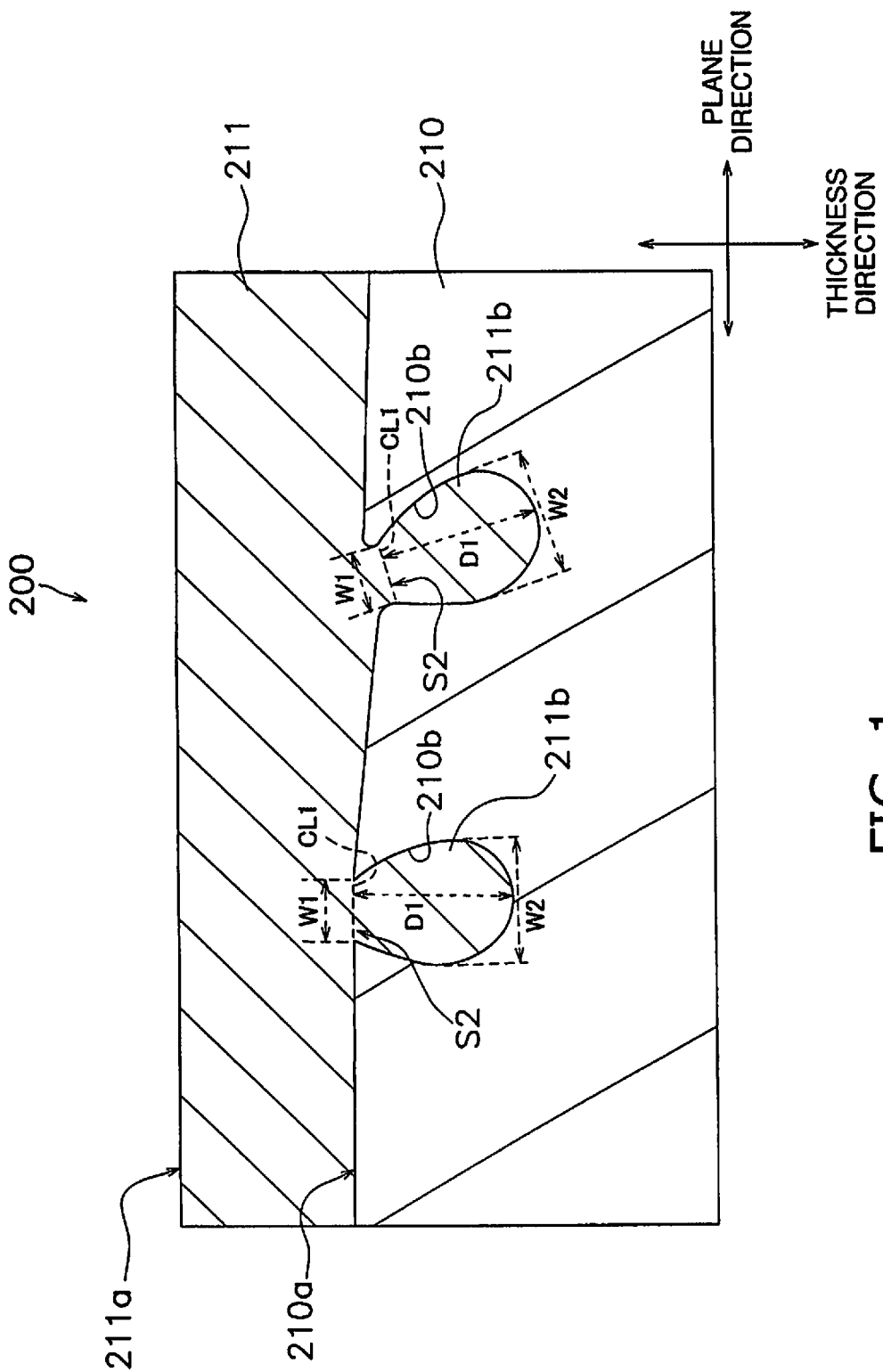
FIG. 1 is a cross-sectional view of an alloy member according to a first embodiment.

FIG. 1 is a cross-sectional view of the alloy member 200 according to the first embodiment. FIG. 1 shows an enlarged portion located near the surface of the alloy member 200.

The alloy member 200 is used in a current collector member for collecting an electrical current from the electrochemical cells, a separator for isolating the electrochemical cells, and a manifold for supplying gas to the electrochemical cells, or the like. The alloy member 200 includes a base member 210 and a chromium oxide layer 211.

The base member 210 is formed into a plate shape. The base member 210 may have a flat plate shape or a curved plate shape. Although there is no particular limitation on the thickness of the base member 210, the thickness thereof may be 0.1 to 2.0 mm, for example.

The base member 210 is constituted by an alloy material containing Cr (chromium). An Fe—Cr-based alloy steel (stainless steel etc.), a Ni—Cr-based alloy steel, or the like may be used as such a metal material. Although there is no particular limitation on the Cr content in the base member 210, the Cr content may be 4 to 30 mass %, for example.

The base member 210 may contain Ti (titanium) and Al (aluminum). Although there is no particular limitation on the Ti content in the base member 210, the Ti content may be 0.01 to 1.0 at. %. Although there is no particular limitation on the Al content in the base member 210, the Al content may be 0.01 to 0.4 at. %. The base member 210 may contain Ti as $TiO_2$ (titania), and Al as $Al_2O_3$ (alumina).

As shown in FIG. 1, the base member 210 has a surface 210a and a plurality of recesses 210b. The surface 210a is an outer surface of the base member 210. The base member 210 is bonded to the chromium oxide layer 211 on the surface 210a. Although the surface 210a may be formed into a flat shape, the surface 210a may be curved or bent entirely or partially, or may be provided with minute recesses and protrusions.

The recesses 210b are formed in the surface 210a. The recesses 210b extend from openings S2 formed in the surface 210a toward an inner portion of the base member 210. Embedded portions 211b (an example of a "separation inhibition portion"), which will be described later, are embedded in the recesses 210b.

The recesses 210b are narrower toward the openings S2. That is, the width of the recess 210b is narrower near the opening S2. A width W1 of the opening S2 indicates the length of a straight line CL connecting edges of the opening S2 at the shortest distance in a cross-section thereof. Although there is no particular limitation on the width W1 of the opening S2, the width W1 may be 0.3 to 30 μm, for example. In consideration of providing the embedded portions 211b, which will be described later, with sufficient strength, it is preferable that the width W1 is 0.5 μm or more.

Note that there is no particular limitation on the shape of the recess 210b as long as the width of the recess 210b is narrower near the opening S2.

The chromium oxide layer 211 is formed on the surface of the base member 210. The chromium oxide layer 211 may cover a substantially entire surface of the base member 210, or cover at least a portion of the surface of the base member 210. The chromium oxide layer 211 contains chromium oxide as the main component.

As shown in FIG. 1, the chromium oxide layer 211 has a surface 211a and a plurality of embedded portions 211b. The surface 211a is an outer surface of the alloy member 200. FIG. 1 shows a cross-section perpendicular to the surface 211a of the chromium oxide layer 211.

The embedded portion 211b is an example of the "separation inhibition portion" for inhibiting the separation of the chromium oxide layer 211 from the base member 210. The embedded portions 211b are embedded in the recesses 210b of the base member 210. The recess 210b may be entirely filled with the embedded portion 211b, or the embedded portion 211b may be partially disposed in the recess 210b.

The embedded portion 211b is constricted at the opening S2 of the recess 210b. That is, the embedded portion 211b is locally small near the opening S2. The anchor effect arises as a result of the embedded portions 211b being locked to the recesses 210b due to such a bottleneck structure. As a result, the adhesive force of the chromium oxide layer 211 to the base member 210 is improved, and it is possible to inhibit the separation of the chromium oxide layer 211 from the base member 210. Thus, it is possible to inhibit the vaporization of chromium from the base member 210 to the outside, and thus to inhibit the electrodes of the electrochemical cells from deteriorating through chromium poisoning. Also, if the alloy member 200 is used as a current collector member for collecting electrical current from the electrochemical cells, it is possible to inhibit a reduction in the electrical current path between the base member 210 and the chromium oxide layer 211, and thus to inhibit an increase in the electric resistance of the alloy member 200.

In this embodiment, "the embedded portion 211b being constricted at the opening S2" means that a width W2 of the embedded portion 211b is larger than the width W1 of the opening S2 in a cross-section perpendicular to the surface 211a of the chromium oxide layer 211. The width W2 of the embedded portion 211b refers to the maximum size of the embedded portion 211b in a direction that is parallel to the straight line CL defining the width W1 of the opening S2.

Size of Embedded Portion 211b

An average depth of the plurality of embedded portions 211b is preferably 0.7 μm or more. Accordingly, a sufficient anchor effect can be exerted as the plurality of embedded portions 211b overall, thus particularly improving the adhesive force of the chromium oxide layer 211 to the base member 210. As a result, it is possible to further inhibit the separation of the chromium oxide layer 211 from the base member 210.

An "average depth" of the plurality of embedded portions 211b indicates a value obtained by arithmetically averaging the depths D1 of ten embedded portions 211b selected at random from at least one image enlarged at a magnification of 1,000 to 20,000 times using a FE-SEM (Field Emission Scanning Electron Microscope). The depth D1 of the embedded portion 211b refers to the maximum size of the embedded portion 211b in the direction that is perpendicular to the straight line CL defining the width W1 of the opening S2. However, an embedded portion 211b having a depth D1 of less than 0.1 μm is excluded when the average depth of the embedded portions 211b is calculated because such an embedded portion 211b has a slight anchor effect.

An average depth of the plurality of embedded portions 211b is preferably 1.0 μm or more, and more preferably 1.5 μm or more. Also, an average depth of the plurality of embedded portions 211b is preferably 30 μm or less.

Although there is no particular limitation on the depth D1 of the embedded portions 211b, the depth D1 may be 0.5 to 30 μm, for example. The standard deviation of the depths D1 of the ten embedded portions 211b used to calculate the average depth is preferably 0.2 or more. Accordingly, the anchor effect of the embedded portions 211b overall can be further improved. Although there is no particular limitation on the ratio of the standard deviation of the depths D1 to the average depth (so-called "coefficient of variation"), the ratio thereof may be 0.1 to 0.95, for example, and is preferably 0.2 to 0.9 inclusive.

Although there is no particular limitation on the difference between the maximum value and the minimum value of the depths D1 in the ten embedded portions 211b used to calculate the average depth, the difference may be 0.5 to 29 μm, for example, and is preferably 1 to 25 μm.

Also, although there is no particular limitation on the average width of the embedded portions 211b, the average width thereof may be 0.5 to 35 μm, for example. An "average width" of the plurality of embedded portions 211b indicates a value obtained by arithmetically averaging the widths W2 of the ten embedded portions 211b used to calculate the average depth.

In consideration of further improving the anchor effect of the plurality of embedded portions 211b overall, the average width of the plurality of embedded portions 211b is preferably 0.5 μm or more, and more preferably 0.7 μm or more.

Although there is no particular limitation on the width W2 of the embedded portions 211b, the width W2 may be 0.5 to 35 μm, for example. In consideration of further improving the anchor effect of the embedded portion 211b, the width W2 of the embedded portion 211b is preferably 101% or more, more preferably 105% or more, and particularly preferably 110% or more of the width W1 of the opening S2.

The standard deviation of the widths W2 of the ten embedded portions 211b used to calculate the average width is preferably 0.2 or more. Accordingly, the anchor effect of the embedded portions 211b overall can be further improved. Although there is no particular limitation on the ratio of the standard deviation of the widths W2 to the average width (so-called "coefficient of variation"), the ratio thereof may be 0.1 to 0.95, for example, and is preferably 0.2 to 0.9 inclusive.

Although there is no particular limitation on the difference between the maximum value and the minimum value of the widths W2 in the ten embedded portions 211b used to calculate the average width, the difference may be 0.5 to 34 µm, for example, and is preferably 1 to 30 µm.

It is preferable that the number of embedded portions 211b present in the surface direction parallel to the surface 210a in a cross-section perpendicular to the surface 210a of the base member 210 is 3 or more/10 mm (that is, 3 or more embedded portions 211b for every 10 mm of the surface 210a). Accordingly, stress applied to the chromium oxide layer 211 can be distributed, and thus it is possible to inhibit minor defects from occurring in the chromium oxide layer 211.

The "number" of embedded portions 211b present in the surface direction refers to the number of embedded portions 211b provided in the unit length of the surface 210a of the base member 210 in a cross-section perpendicular to the surface 211a of the chromium oxide layer 211. The number of present embedded portions 211b indicates a value obtained by dividing the total number of embedded portions 211b by the total length of the surface 210a on the above-described FE-SEM image. When the number of embedded portions 211b is counted, an embedded portion 211b that partially appears in the FE-SEM image is also counted as one embedded portion 211b. However, an embedded portion 211b having a depth D1 of less than 0.5 µm is excluded when the number of present embedded portions 211b is calculated because such an embedded portion 211b makes little contribution to the stress distribution effect.

The number of embedded portions 211b present in the surface direction is more preferably 100 or less/mm (that is, 100 or less embedded portions 211b per mm). This makes it possible to inhibit recesses 210b from being linked to each other, and thus to maintain the shapes of the recesses 210b for a long period of time.

Although there is no particular limitation on the average equivalent circle diameter of the plurality of embedded portions 211b, the average equivalent circle diameter thereof may be 0.5 to 35 µm. An "average equivalent circle diameter" of the plurality of embedded portions 211b indicates a value obtained by arithmetically averaging the equivalent circle diameters of the ten embedded portions 211b used to calculate the average depth. An "equivalent circle diameter" is the diameter of a circle having the same area as an embedded portion 211b on the above-described FE-SEM image. It is assumed that when the area of the embedded portion 211b is obtained, the base end portion of the embedded portion 211b is defined by the straight line CL defining the width W1 of the opening S2.

Angle of Embedded Portion 211b

Figure 2:
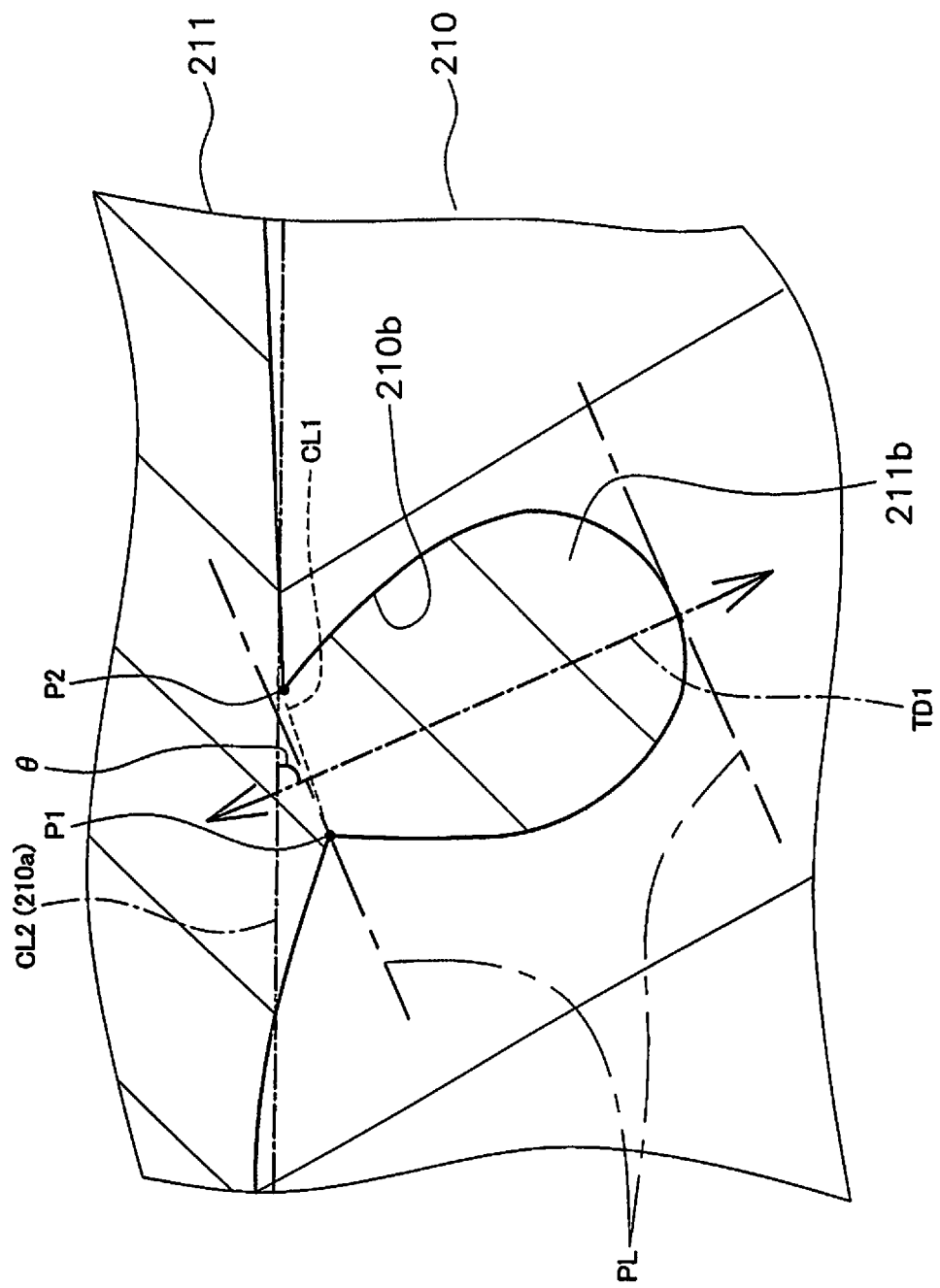
FIG. 2 is an enlarged cross-sectional view of an example of an embedded portion according to the first embodiment.

FIG. 2 is an enlarged cross-sectional view of an example of the embedded portion 211b. FIG. 2 shows a cross-section perpendicular to the surface 211a of the chromium oxide layer 211.

As shown in FIG. 2, an angle θ formed by a depth direction TD1 of the embedded portion 211b with respect to the surface 210a in a cross-section perpendicular to the surface 211a of the chromium oxide layer 211 is preferably an acute angle. That is, the embedded portion 211b is inclined with respect to the surface 210a. Accordingly, a larger anchor effect can be exerted, compared to the case where the embedded portion 211b is provided straight with respect to the surface 210a, and thus it is possible to improve the adhesive force of the chromium oxide layer 211 to the base member 210. As a result, it is possible to further inhibit the separation of the chromium oxide layer 211 from the base member 210.

An "angle θ formed by the depth direction TD1 of the embedded portion 211b with respect to the surface 210a" is defined as follows. First, as shown in FIG. 2, a region of the embedded portion 211b is defined using the straight line CL1 defining the width W1 of the opening S2 on the image enlarged at a magnification of 1,000 to 20,000 times by a FE-SEM. Then, a direction that is perpendicular to two parallel tangent lines PL that hold the embedded portion 211b and are fixed at positions at which the distance between the two parallel tangent lines PL is at the maximum when the two parallel tangent lines PL are rotated 180 degrees is set as the "depth direction TD1". The distance between the two parallel tangent lines PL at this time is so-called "the maximum Feret diameter" of the embedded portion 211b. Then, two points at which the straight line CL1 intersects the surface 210a are set as reference points P1 and P2. Then, a virtual approximate straight line CL2 is drawn using the method of least squares with the use of a 100 µm range of the surface 210a that starts from one reference point P1 and a 100 µm range of the surface 210a that starts from the other reference point P2. The approximate straight line CL2 indicates the surface 210a used to calculate the angle θ. That is, the approximate straight line CL2 indicates the surface 210a in the calculation of the angle θ. Also, the angle of the depth direction TD1 with respect to the approximate straight line CL2 is the angle θ formed by the depth direction TD1 of the embedded portion 211b with respect to the surface 210a.

Considering further improvement of the anchor effect of the embedded portion 211b, the angle θ formed by the depth direction TD1 of the embedded portion 211b is preferably 89 degrees or less, more preferably 85 degrees or less, and further preferably 80 degrees or less.

As shown in FIG. 1, if the chromium oxide layer 211 has a plurality of embedded portions 211b, the embedded portions 211b may have different angles θ formed by the depth direction TD1 of the embedded portions 211b, or may have the same angle θ. Also, the embedded portions 211b may have different depth directions TD1 of the embedded portions 211b, or may have the same depth direction TD1. It is preferable that at least one of the angle θ and the depth direction TD1 changes for each embedded portion 211b because the anchor effect of the embedded portions 211b overall can be significantly improved.

Shape of Outer Edge of Recess 210b

Figure 3:
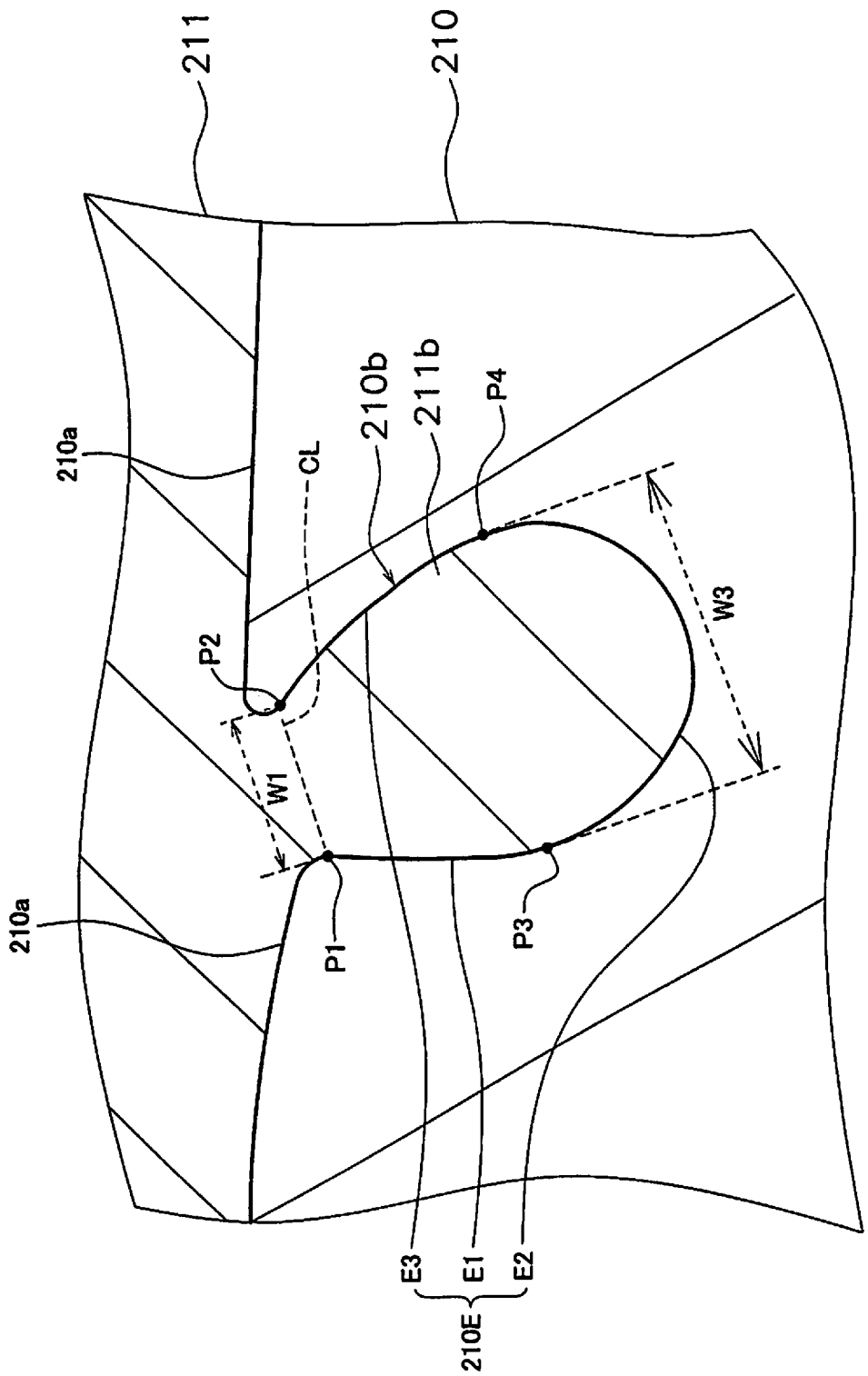
FIG. 3 is an enlarged cross-sectional view of an example of a recess according to the first embodiment.

FIG. 3 is an enlarged cross-sectional view of an example of the recess 210b. FIG. 3 shows a cross-section perpendicular to the surface 211a of the chromium oxide layer 211.

As shown in FIG. 3, at least a portion of an outer edge 210E of the recess 210b is preferably curved. Accordingly, stress is distributed in the curved region of the outer edge 210E of the recess 210b when the alloy member 200 expands or contracts, and thus it is possible to inhibit the stress from being locally concentrated. Therefore, it is possible to inhibit the embedded portions 211b embedded in the recesses 210b from being damaged, and thus to maintain the anchor effect resulting from the embedded portions 211b for a long period of time.

The outer edge 210E of the recess 210b includes the first and second reference points P1 and P2 defining the opening width W1 of the opening S2, and third and fourth reference points P3 and P4 defining a maximum width W3 of the recess 210b.

The maximum width W3 of the recess 210b indicates the maximum size of the recess 210b in a direction that is parallel to the straight line CL defining the opening width W1. Although the maximum width W3 of the recess 210b is the same as the above-described width W2 of the embedded portion 211b in this embodiment, the maximum width W3 need not be the same as the width W2 of the embedded portion 211b. Although there is no particular limitation on the maximum width W3 of the recess 210b, the maximum width W3 may be 0.5 to 35 μm, for example.

The outer edge 210E of the recess 210b includes a first outer edge portion E1 extending from the first reference point P1 to the third reference point P3, a second outer edge portion E2 extending from the third reference point P3 to the fourth reference point P4, and a third outer edge portion E3 extending from the fourth reference point P4 to the second reference point P2.

The outer edge 210E of the recess 210b is constituted as a result of the first to third outer edge portions E1 to E3 being successively connected to each other. The first outer edge portion E1 indicates a side wall located on one side of the recess 210b. The third outer edge portion E3 indicates a side wall located on the other side of the recess 210b. The second outer edge portion E2 indicates the bottom wall of the recess 210b.

In this embodiment, the first to third outer edge portions E1 to E3 are each entirely curved. Thus, it is possible to effectively inhibit stress from being concentrated at the first to third outer edge portions E1 to E3, and thus to entirely protect the embedded portion 211b of the chromium oxide layer 211.

However, it is not necessary for all of the first to third outer edge portions E1 to E3 to be curved, and it is sufficient that at least one of the first to third outer edge portions E1 to E3 is curved. Also, the first to third outer edge portions E1 to E3 may each partially include a linear region.

In this embodiment, the first outer edge portions E1 and the second outer edge portion E2 are smoothly connected to each other at the third reference point P3. Specifically, the first outer edge portion E1 and the second outer edge portion E2 are connected to each other while curving. Thus, it is possible to effectively inhibit stress from being concentrated at the boundary between the side wall and the bottom surface of the recess 210b where stress is likely to be concentrated, and thus to further inhibit the embedded portion 211b from being damaged.

Also, the second outer edge portion E2 and the third outer edge portion E3 are smoothly connected to each other at the fourth reference point P4. Specifically, the second outer edge portion E2 and the third outer edge portion E3 are connected to each other while curving. Thus, it is possible to effectively inhibit stress from being concentrated at the boundary between the side wall and the bottom surface of the recess 210b where stress is likely to be concentrated, and thus to further inhibit the embedded portion 211b from being damaged.

Also, the first outer edge portion E1 and the surface 210a of the base member 210 are smoothly connected to each other at the first reference point P1. Specifically, the first outer edge portion E1 and the surface 210a are connected to each other while curving. Thus, it is possible to effectively inhibit stress from being concentrated at the boundary between the side wall of the recess 210b and the surface 210a of the base member where stress is likely to be concentrated, and thus to further inhibit the embedded portion 211b from being damaged.

Also, the third outer edge portion E3 and the surface 210a of the base member 210 are smoothly connected to each other at the second reference point P2. Specifically, the third outer edge portion E3 and the surface 210a are connected to each other while curving. Thus, it is possible to effectively inhibit stress from being concentrated at the boundary between the side wall of the recess 210b and the surface 210a of the base member where stress is likely to be concentrated, and thus to further inhibit the embedded portion 211b from being damaged.

In this embodiment, the second outer edge portion E2 protrudes toward the base member 210. That is, the bottom surface of the recess 210b is formed into a shape protruding into the base member 210. Thus, it is possible to effectively inhibit stress from being concentrated near the bottom surface of the recess 210b, and thus to effectively protect a leading end portion of the embedded portion 211b that is most likely to be damaged.

Method for Manufacturing Alloy Member 200

First, a plurality of recesses are formed in the surface 210a of the base member 210. It is possible to efficiently form recesses having a predetermined shape using shot peening, sand blasting, or wet blasting, for example. The average depth, angle θ, and the like of the embedded portions 211b, which will be formed in a downstream process, can be controlled by adjusting the depth and the angle of the recesses. Also, the number of embedded portions 211b present in the surface direction can be controlled by adjusting the number of recesses in the surface direction.

Then, by rolling a roller on the surface 210a of the base member 210, the openings S2 are narrowed while the peripheries of the openings S2 of the recesses 210b are flattened. At this time, the width W1 of the openings S2 can be adjusted by adjusting a pressing force of the roller.

Then, the chromium oxide layer 211 is formed on the surface 210a of the base member 210 and in the recesses 210b as a result of applying a chromium oxide paste onto the surface 210a of the base member 210 to fill the recesses 210b with the chromium oxide paste, and subjecting the base member 210 to heat treatment (800° C. to 900° C., 5 to 20 hours) in an atmosphere. Accordingly, the embedded portions 211b embedded in the recesses 210b are formed.

2. Second Embodiment

Figure 4:
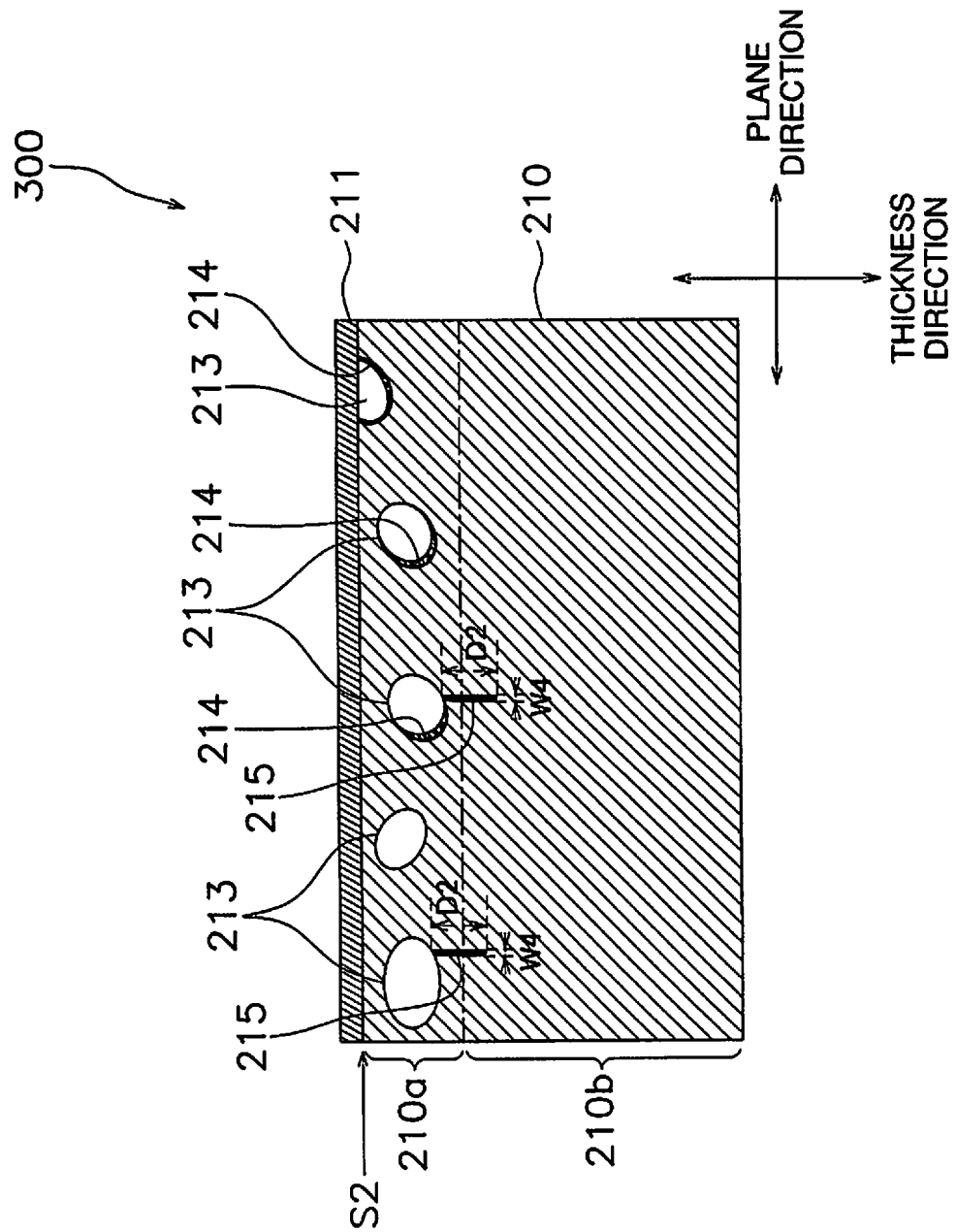
FIG. 4 is a cross-sectional view of an alloy member according to a second embodiment.

An alloy member 300 according to a second embodiment will be described with reference to the drawings. FIG. 4 is a cross-sectional view of the alloy member 300 according to the second embodiment. FIG. 4 shows an enlarged portion located near the surface of the alloy member 300.

The alloy member 300 includes a base member 210 and a chromium oxide layer 211.

The base member 210 is formed into a plate shape. The base member 210 may have a flat plate shape or a curved plate shape. Although there is no particular limitation on the thickness of the base member 210, the thickness thereof may be 0.1 to 2.0 mm, for example.

The base member 210 is constituted by an alloy material containing Cr (chromium). An Fe—Cr-based alloy steel (stainless steel etc.), a Ni—Cr-based alloy steel, or the like may be used as such a metal material. Although there is no particular limitation on the Cr content in the base member 210, the Cr content may be 4 to 30 mass %.

The base member 210 may contain Ti (titanium) and Al (aluminum). Although there is no particular limitation on the Ti content in the base member 210, the Ti content may be 0.01 to 1.0 at. %. Although there is no particular limitation on the Al content in the base member 210, the Al content may be 0.01 to 0.4 at. %. The base member 210 may contain Ti as $TiO_2$ (titania), and Al as $Al_2O_3$ (alumina).

The chromium oxide layer 211 is formed on the base member 210. The chromium oxide layer 211 covers at least a portion of the base member 210. Although it is sufficient that the chromium oxide layer 211 covers at least a portion of the base member 210, the chromium oxide layer 211 may cover a substantially entire surface of the base member 210. The chromium oxide layer 211 contains chromium oxide as the main component. In this embodiment, a composition X containing a substance Y "as the main component" means that the substance Y accounts for 70 wt % or more of the entire composition X. Although there is no particular limitation on the thickness of the chromium oxide layer 211, the thickness thereof may be 0.1 to 20 µm, for example.

Here, the base member 210 includes an interface region 210a and an inner region 210b. The interface region 210a is a region of the base member 210 located 30 µm or less from an interface S2 between the base member 210 and the chromium oxide layer 211. The inner region 210b is a region located more than 30 µm away from the interface S2.

The base member 210 has pores 213 formed in the interface region 210a. The pore 213 is an example of the "separation inhibition portion" for inhibiting the separation of the chromium oxide layer 211 from the base member 210. As a result of the pores 213 being formed in the interface region 210a, it is possible to inhibit the separation of the chromium oxide layer 211 from the base member 210 when the alloy member 300 expands or contracts. Specifically, because the flexibility of the interface region 210a is increased as a result of disposing the pores 213 in the interface region 210a of the base member 210, it is possible to reduce the stress occurring at the interface between the base member 210 and the chromium oxide layer 211. As a result, it is possible to inhibit the separation of the chromium oxide layer 211 from the base member 210. Thus, it is possible to inhibit the vaporization of chromium from the base member 210 to the outside, and thus to inhibit the electrodes of the electrochemical cells from deteriorating through chromium poisoning. Also, if the alloy member 300 is used as a current collector member for collecting electrical current from the electrochemical cells, it is possible to inhibit a reduction in the electrical current path between the base member 210 and the chromium oxide layer 211, and thus to inhibit an increase in the electric resistance of the alloy member 300.

As shown in FIG. 4, the base member 210 preferably has a plurality of pores 213. This makes it possible to reduce the stress occurring at the interface S2 in a wide range, and thus to further inhibit the separation of the chromium oxide layer 211.

If the base member 210 has a plurality of pores 213, there is no particular limitation on the intervals between the pores 213, and the intervals therebetween need not be constant. Although the pores 213 are disposed one-by-one in the thickness direction of the base member 210 in FIG. 4, two or more pores 213 may be disposed in the thickness direction. Also, the pores 213 may be in contact with the interface S2, or may be separated from the interface S2.

If the base member 210 has a plurality of pores 213, the average equivalent circle diameter of the pores 213 is preferably 0.5 µm to 20 µm inclusive. As a result of the pores 213 having an average equivalent circle diameter of 0.5 µm or more, it is possible to sufficiently improve the flexibility of the interface region 210a and to sufficiently reduce the stress that occurs at the interface S2. Also, as a result of the pores 213 having an average equivalent circle diameter of 20 µm or less, it is possible to inhibit the local deformation of the peripheries of the pores 213, and thus to further inhibit the separation of the chromium oxide layer 211.

An "equivalent circle diameter" of a pore 213 refers to the diameter of a circle having the same area as a pore 213 in an image obtained by enlarging a cross-section of the interface region 210a in the thickness direction at a magnification of 1,000 to 20,000 times using a FE-SEM (Field Emission-Scanning Electron Microscope). An "average equivalent circle diameter" indicates a value obtained by arithmetically averaging the equivalent circle diameters of ten pores 213 selected at random from the above-described FE-SEM image. When the average equivalent circle diameter is obtained, ten pores 213 having a pore size of more than 0.1 µm are selected at random from FE-SEM images obtained at ten portions of the interface region 210a.

The pores 213 preferably have an average aspect ratio of 3 or less. Accordingly, the pores 213 are more likely to deform. The aspect ratio of a pore 213 is a value obtained by dividing the maximum Feret diameter of the pore 213 by the minimum Feret diameter thereof. The maximum Feret diameter is the distance between two parallel straight lines when the pore 213 is held such that the distance between the two parallel straight lines is at the maximum on the above-described FE-SEM image. The minimum Feret diameter is the distance between two parallel straight lines when the pore 213 is held such that the distance between the two parallel straight lines is at the minimum on the above-described FE-SEM image. An average aspect ratio is a value obtained by arithmetically averaging aspect ratios of ten pores 213 whose average equivalent circle diameter is to be measured.

The number of pores 213 present in the surface direction is preferably 5 or more/mm (that is, 5 or more pores 213 per mm). Accordingly, it is possible to further reduce the stress occurring at the interface S2 as a result of further improving the flexibility of the interface region 210a, and thus to inhibit minor defects from occurring in the chromium oxide layer 211. Also, the number of pores 213 present in the surface direction is more preferably 100 or less/mm (that is, 100 or less pores 213 per mm). Accordingly, it is possible to inhibit the pores 213 from being linked to each other, and thus to more easily control the shapes of the pores 213.

The number of present pores 213 is the number of pores 213 disposed in the unit length. The number of present pores 213 is a value obtained by dividing the total number of pores 213 by the total length of the interface S2 on the above-described FE-SEM image. When the total number of pores 213 is counted, a pore 213 that partially appears in the FE-SEM image is also counted as one pore 213.

Note that although the pores 213 are not formed in the inner region 210b in FIG. 4, the pores 213 may also be formed in the inner region 210b.

Metal Oxide 214 in Pore 213

As shown in FIG. 4, the base member 210 preferably includes metal oxides 214 disposed on inner surfaces of the pores 213.

The metal oxides 214 cover at least portions of the inner surfaces of the pores 213. Accordingly, even if a phenomenon occurs in which a portion of the chromium oxide layer 211 grows to extend toward the inner portion of the base member 210 (referred to as an "abnormal oxidation phenomenon" hereinafter), it is possible to maintain the forms of the metal oxides 214, as a result of which it is possible to maintain the shapes of the pores 213. Thus, it is possible to maintain the stress reduction effect resulting from the pores 213 for a long period of time.

An "abnormal oxidation phenomenon" refers to a phenomenon occurring as a result of oxidation of the base member 210 being locally progressed in a case where minute defects are present in the chromium oxide layer 211, for example. When an abnormal oxidation phenomenon occurs, if the pores 213 are not protected by the metal oxides 214, the pores 213 are reduced in size or disappear as a result of the peripheries of the pores 213 in the base member 210 being oxidized and undergoing volume expansion.

Although the metal oxide 214 can be constituted by oxides of a single metal element (FeO, $Fe_2O_3$, $Fe_3O_4$, $Cr_2O_3$, CaO, $Al_2O_3$, MnO, $Mn_3O_4$, $SiO_2$, $Al_2O_3$, and $TiO_2$), complex oxides constituted by a plurality of metal elements ((Fe, $Cr)_3O_4$, (Mn, $Cr)_3O_4$), and the like, for example, the metal oxide 214 is not limited thereto.

The metal oxide 214 is preferably an oxide of an element whose equilibrium oxygen pressure is lower than that of the major element of the base member 210 (referred to as a "low-equilibrium oxygen pressure element" hereinafter). Because the low-equilibrium oxygen pressure element has a greater affinity for oxygen than the major element of the base member 210, it is possible to maintain the form of a more stable oxide in the base member 210.

Although examples of the low-equilibrium oxygen pressure element include Ti, Al, Ca, Si, Mn, and Cr, the low-equilibrium oxygen pressure element is not limited thereto. Although an example of an oxide of a low-equilibrium oxygen pressure element is at least one selected from $TiO_2$, $Al_2O_3$, CaO, $SiO_2$, manganese oxides (e.g., MnO and $Mn_3O_4$), (Mn, $Cr)_3O_4$, chromium oxides (e.g., CrO and $Cr_2O_3$), and the like, the oxide thereof is not limited thereto.

It is preferable that the metal content in the metal oxide 214 is 0.3 or more in terms of a cation ratio when a molar ratio of the elements to the sum of all constituent elements excluding oxygen is defined as the cation ratio. This makes it possible to inhibit the pores 213 from being reduced through an abnormal oxidation phenomenon. The metal content in the metal oxide 214 is more preferably 0.4 or more, and particularly preferably 0.5 or more, in terms of the cation ratio.

The metal content in the metal oxide 214 can be obtained as a result of measuring, using EDX of a STEM (Scanning Transmission Electron Microscope), in terms of the cation ratio, the metal contents at ten portions selected at random from the metal oxides 214 disposed on the inner surfaces of the pores 213, and arithmetically averaging the values measured at the ten portions.

The metal oxide 214 may contain only one type of metal oxide, or may contain two or more types thereof. If the metal oxide 214 contains two or more types of metal oxides, the metal oxides may constitute a mixture in which the metal oxides are mixed together.

The metal oxides 214 may be present in the form of particles that are dispersed on the inner surfaces of the pores 213, or may substantially form a layer. Thus, the metal oxides 214 may cover the entire inner surfaces of the pores 213, or may cover only portions of the inner surfaces of the pores 213. Even if the metal oxides 214 cover only portions of the inner surfaces of the pores 213, it is possible to obtain the effect of maintaining the shapes of the pores 213, compared to the case where no metal oxides 214 are present. Although there is no particular limitation on the thickness of the metal oxide 214 when the metal oxide 214 forms a layer, the thickness thereof may be 0.1 to 5 µm, for example.

Extending Portion 215 that Extends from Pore 213

As shown in FIG. 4, the base member 210 preferably has an extending portion 215 extending from a pore 213. Substantially the entire extending portion 215 is embedded in the base member 210, and one end portion thereof is exposed at the inner surface of the pore 213. The extending portion 215 contains an oxide of an element whose equilibrium oxygen pressure is lower than that of the major element of the base member 210 (referred to as a "low-equilibrium oxygen pressure element" hereinafter). Because the low-equilibrium oxygen pressure element has a greater affinity for oxygen than the major element of the base member 210, oxygen that permeates the base member 210 and remains in the pores 213 can be preferentially taken into the extending portion 215. Thus, it is possible to inhibit the oxidation of portions of the base member 210 that surround the pores 213, and thus to maintain the shapes of the pores 213 for a long period of time. As a result, it is possible to maintain the stress reduction effect resulting from the pores 213 for a long period of time.

Although examples of the low-equilibrium oxygen pressure element include Ti, Al, Ca, Si, Mn, and Cr, the low-equilibrium oxygen pressure element is not limited thereto. Although an example of an oxide of the low-equilibrium oxygen pressure element is at least one selected from manganese oxides (e.g., MnO and $Mn_3O_4$), (Mn, $Cr)_3O_4$, and chromium oxides (e.g., CrO and $Cr_2O_3$), $TiO_2$, $Al_2O_3$, CaO, $SiO_2$, manganese oxides (e.g., MnO and $Mn_3O_4$), (Mn, $Cr)_3O_4$, chromium oxides (e.g., CrO and $Cr_2O_3$), and the like, the oxide thereof is not limited thereto.

It is preferable that the content of low-equilibrium oxygen pressure elements in the extending portion 215 is 0.3 or more in terms of a cation ratio when a molar ratio of the elements to the sum of all constituent elements excluding oxygen is defined as the cation ratio. Accordingly, oxygen in the pores 213 can be preferentially taken into the extending portions 215. The content of the low-equilibrium oxygen pressure elements in the extending portion 215 is more preferably 0.4 or more, and particularly preferably 0.5 or more, in terms of the cation ratio.

The content of the low-equilibrium oxygen pressure elements in an extending portion 215 can be obtained as a result of measuring, using EDX of a STEM, in terms of the cation ratio, the contents of the low-equilibrium oxygen pressure elements at ten points at which the total length of the extending portion 215 extending from a pore 213 is divided into eleven portions, and arithmetically averaging the values measured at the ten points.

The extending portion 215 may contain only one type of oxide of a low-equilibrium oxygen pressure element, or may contain two or more types thereof. If the extending portion 215 contains two or more types of oxides of a low-equilibrium oxygen pressure element, the two or more types of oxides may constitute a mixture in which the oxides are mixed together.

As shown in FIG. 4, the extending portion 215 preferably extends from a pore 213 in a direction away from the chromium oxide layer 211. That is, the extending portion 215 preferably extends from the pore 213 in the opposite direction to the chromium oxide layer 211. Accordingly, it is possible to inhibit the extending portion 215 from coming into contact with the chromium oxide layer 211 as a result of the extending portion 215 growing and becoming exposed from the base member 210, and thus to maintain the adherence between the base member 210 and the chromium oxide layer 211.

Although the extending portion 215 is formed into a linear shape extending in the thickness direction perpendicular to the interface S2 in this embodiment, there is no particular limitation on the shape of the extending portion 215. The extending portion 215 may be curved or bent entirely or partially.

Although there is no particular limitation on a length D1 of the extending portion 215, the length D1 may be 0.5 to 30 µm, for example. The length D1 of the extending portion 215 refers to the maximum size of the extending portion 215 in the thickness direction perpendicular to the interface S2. The length D1 of the extending portion 215 is preferably 1.5 to 20 µm. The entire extending portion 215 may be disposed in the interface region 210a, or a portion of the extending portion 215 may be disposed in the inner region 210b. That is, a portion of the extending portion 215 may be located 30 µm or more away from the interface S2.

Although there is no particular limitation on a width W4 of the extending portion 215, the width W4 may be 0.2 to 4.0 µm, for example. The width W4 of the extending portion 215 refers to the maximum size of the extending portion 215 in the surface direction parallel to the interface S2. The width W4 of the extending portion 215 is preferably smaller than the length D1. The width W4 of the extending portion 215 is preferably 0.5 µm to 3.0 µm.

Method for Manufacturing Alloy Member 300

First, if extending portions 215 are provided in pores 213, small holes are formed in the surface of the base member 210. It is possible to efficiently form small holes having a desired diameter through laser radiation, for example. At this time, the size of the small holes can be adjusted by controlling the laser output and the radiation time, and appropriately selecting a lens to be used. A YAG laser, a carbon dioxide laser, or the like can be used as the laser, for example.

Then, the small holes are filled with a paste obtained by adding ethyl cellulose and terpineol to a powder of oxides of low-equilibrium oxygen pressure elements.

Then, large holes whose diameter is larger than that of the small holes are formed. It is possible to efficiently form large holes having a desired diameter through laser radiation, for example. At this time, the size of the large holes can be adjusted by controlling the laser output and the radiation time, and appropriately selecting a lens to be used. In particular, the size of the large holes are adjusted such that the paste with which the small holes are filled remains at the leading end portions of the small holes. A YAG laser, a carbon dioxide laser, or the like can be used as the laser, for example.

Then, a degreasing heat treatment is performed at 350° C. for 1 hour in order to completely remove ethyl cellulose and terpineol included in the paste with which the small holes are filled. Because oxidation does not progress on the surface of the base member 210 under these heat treatment conditions, ductility of the base member 210 is maintained.

Note that if no extending portion 215 is provided in the pores 213, it is sufficient to form only large holes without forming small holes.

Then, if the metal oxide 214 is formed in the pore 213, the metal oxide 214 is formed on the inner surface of each large hole through sputtering with the metal oxide targeted. VS-R400G manufactured by SCREEN Finetech Solutions Co., Ltd. can be used in sputtering.

Then, the pores 213 are formed as a result of covering openings of the large holes by rolling a roller on the surface of the base member 210. At this time, the openings of the large holes may be completely covered, or the openings may be kept open.

Then, as a result of performing heat treatment (800° C. to 900° C., 5 to 20 hours) on the base member 210 in an atmosphere, the paste is solidified to form the extending portions 215, and the chromium oxide layer 211 is formed on the surface of the base member 210.

3. Third Embodiment

Figure 5:
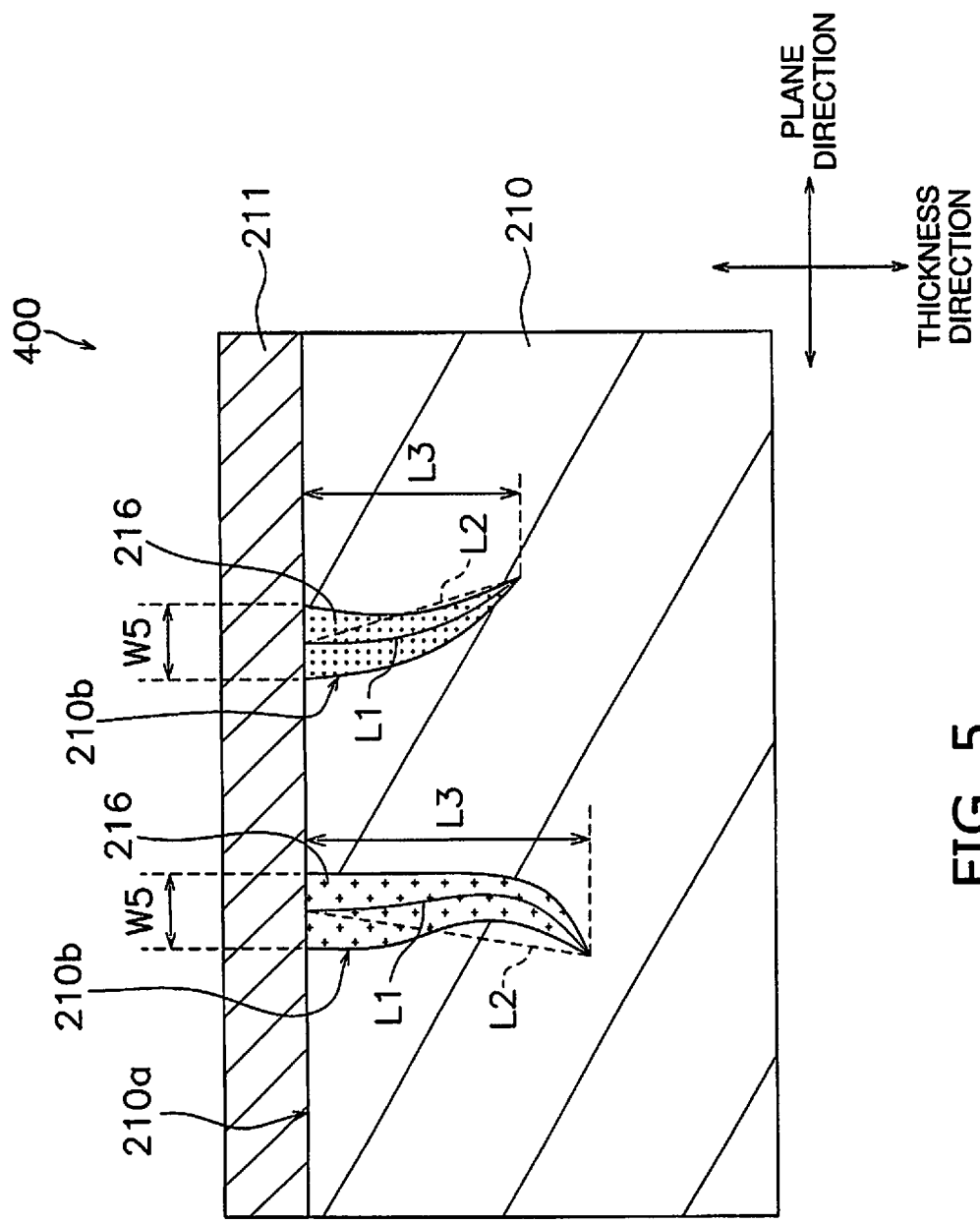
FIG. 5 is a cross-sectional view of an alloy member according to a third embodiment.

An alloy member 400 according to a third embodiment will be described with reference to the drawings. FIG. 5 is a cross-sectional view of the alloy member 400 according to the third embodiment. FIG. 5 shows an enlarged portion located near the surface of the alloy member 400.

The alloy member 400 includes a base member 210, a chromium oxide layer 211, and anchor portions 216.

The base member 210 is formed into a plate shape. The base member 210 may have a flat plate shape or a curved plate shape. Although there is no particular limitation on the thickness of the base member 210, the thickness thereof may be 0.5 to 4.0 mm, for example.

The base member 210 is constituted by an alloy material containing Cr (chromium). An Fe—Cr-based alloy steel (stainless steel etc.), a Ni—Cr-based alloy steel, or the like may be used as such a metal material. Although there is no particular limitation on the Cr content in the base member 210, the Cr content may be 4 to 30 mass %.

The base member 210 may contain Ti (titanium) and Al (aluminum). Although there is no particular limitation on the Ti content in the base member 210, the Ti content may be 0.01 to 1.0 at. %. Although there is no particular limitation on the Al content in the base member 210, the Al content may be 0.01 to 0.4 at. %. The base member 210 may contain Ti as $TiO_2$ (titania), and Al as $Al_2O_3$ (alumina).

The base member 210 has a surface 210a and a plurality of recesses 210b. The surface 210a is an outer surface of the base member 210. The base member 210 is bonded to the chromium oxide layer 211 on the surface 210a. Although the surface 210a is formed into a substantially planar shape in FIG. 5, the surface 210a may be provided with minute recesses and protrusions, or may be curved or bent entirely or partially.

The recesses 210b are formed in the surface 210a. The recesses 210b extend from the surface 210a toward an inner portion of the base member 210. Anchor portions 216, which will be described later, are embedded in the recesses 210b.

Although there is no particular limitation on the number of recesses 210b, the recesses 210b are preferably widely distributed in the surface 210a. Also, although there is no particular limitation on the intervals between recesses 210b, it is particularly preferable that the recesses 210b are disposed at equal intervals. Accordingly, the anchor effect resulting from the anchor portions 216 can be evenly exerted on the entire chromium oxide layer 211, thus particularly inhibiting the separation of the chromium oxide layer 211 from the base member 210.

The cross-sectional shapes of the recesses 210b are curved or bent entirely or partially. The cross-sectional shape of a recess 210b is not a linear shape, but a shape in which at least a portion thereof is warped. The deepest portion of the recess 210b may have an acute angle, an obtuse angle, or a round shape. FIG. 5 shows, as an example, a wedge-shaped recess 210b that is curved entirely (the right side in FIG. 5), and a wedge-shaped recess 210b having a curved lower half (the left side in FIG. 5).

The chromium oxide layer 211 is formed on the surface 210a of the base member 210. The chromium oxide layer 211 covers at least a portion of the surface 210a of the base member 210. The chromium oxide layer 211 is connected to the anchor portions 216. The chromium oxide layer 211 is formed covering the anchor portions 216. Although there is no particular limitation on the thickness of the chromium oxide layer 211, the thickness thereof may be 0.5 µm to 10 µm.

The anchor portion 216 is an example of the "separation inhibition portion" for inhibiting the separation of the chromium oxide layer 211 from the base member 210. The anchor portions 216 are disposed in the recesses 210b of the base member 210. The anchor portions 216 are connected to the chromium oxide layer 211 near opening portions of the recesses 210b.

In a cross-section of the base member 210 in the thickness direction, an average actual length of the plurality of anchor portions 216 is longer than an average straight line length of the plurality of anchor portions 216. This means that at least one of the anchor portions 216 is warped due to at least one of the anchor portions 216 being curved or bent entirely or partially. Thus, the anchor effect of the anchor portions 216 on the base member 210 can be increased, thus inhibiting the separation of the chromium oxide layer 211 from the base member 210. Thus, it is possible to inhibit the vaporization of chromium from the base member 210 to the outside, and thus to inhibit the electrodes of the electrochemical cells from deteriorating through chromium poisoning. Also, if the alloy member 400 is used as a current collector member for collecting electrical current from the electrochemical cells, it is possible to inhibit a reduction in the electrical current path between the base member 210 and the chromium oxide layer 211, and thus to inhibit an increase in the electric resistance of the alloy member 400.

The average actual length of the plurality of anchor portions 216 refers to the average value of actual lengths L1 of the anchor portions 216. As shown in FIG. 5, the actual length L1 refers to the length of a line segment obtained by connecting midpoints of a portion of an anchor portion 216 embedded in a recess 210b in a surface direction perpendicular to the thickness direction. The actual length L1 indicates the total length of the anchor portion 216 in the direction in which the anchor portion 216 extends.

The average actual length of the anchor portions 216 can be obtained by arithmetically averaging the actual lengths L1 of twenty anchor portions 216 that are selected at random from an image obtained by enlarging a cross-section of the base member 210 at a magnification of 1,000 to 20,000 times using a FE-SEM (Field Emission Scanning Electron Microscope). Note that, if twenty anchor portions 216 cannot be observed in one cross-section, twenty anchor portions 216 need only to be selected from a plurality of cross-sections. However, an anchor portion 216 having an actual length L1 of less than 0.1 µm is excluded when the average actual length of the anchor portions 216 is calculated because such an anchor portion 216 has a slight anchor effect, and makes little contribution to the effect of inhibiting the separation of the chromium oxide layer 211.

The average straight line length of the plurality of anchor portions 216 refers to the average value of straight line lengths L2 of the anchor portions 216. As shown in FIG. 5, the straight line length L2 refers to the length of a straight line connecting the start point and the end point of a line segment that defines the actual length L1. The straight line length L2 indicates the shortest distance between both ends of the anchor portion 216.

The average straight line length of the plurality of anchor portions 216 can be obtained by arithmetically averaging the straight line lengths L2 of the twenty anchor portions 216 selected in order to obtain the above-described average actual length.

Note that, although the actual length L1 is substantially the same as the straight line length L2 if the anchor portion 216 is entirely linearly formed, the actual length L1 is longer than the straight line length L2 if at least a portion thereof is warped as the anchor portion 216 according to this embodiment. As shown in FIG. 5, the anchor portions 216 may have different actual lengths Li and different straight line lengths L2, or may have the same actual length L1 and the same straight line length L2.

Although there is no particular limitation on the average actual length, the average actual length may be 0.5 µm to 600 µm inclusive, for example. Although there is no particular limitation on the average straight line length, the average straight line length may be 0.4 µm to 550 µm inclusive, for example.

Although there is no particular limitation on the average vertical length of the anchor portions 216 in a cross-section of the base member 210 along the thickness direction, the average vertical length thereof may be 0.4 µm to 500 µm inclusive, for example. The average vertical length refers to the average value of vertical lengths L3 of the anchor portions 216. As shown in FIG. 5, the vertical length L3 refers to the total length of the anchor portion 216 in the thickness direction that is perpendicular to the surface 210a of the base member 210. As shown in FIG. 5, the anchor portions 216 may have different vertical lengths L3, or may have the same vertical length L3.

Also, it is preferable that the average bonding width of the plurality of anchor portions 216 and the chromium oxide layer 211 is 0.1 µm or more in a cross-section of the base member 210 along the thickness direction. Accordingly, the bonding strength between the anchor portions 216 and the chromium oxide layer 211 is increased, thus inhibiting the anchor portions 216 from breaking away from the chromium oxide layer 211. As a result, it is possible to further inhibit the separation of the chromium oxide layer 211 from the base member 210.

The average bonding width of the plurality of anchor portions 216 refers to the average value of bonding widths W5 of the anchor portions 216. The bonding width W5 refers to the total length of a tangent line between the anchor portion 216 and the chromium oxide layer 211 in a cross-section of the base member 210 along the thickness direction. The tangent line between the anchor portion 216 and the chromium oxide layer 211 may be a straight line, a curved line, a wavy line, or the like.

The average bonding width of the plurality of anchor portions 216 can be obtained by arithmetically averaging bonding widths W5 of the twenty anchor portions 216 selected in order to obtain the above-described average vertical length.

Note that there is no particular limitation on the upper limit of the bonding width W5, and the upper limit thereof may be 100 µm or less, for example.

Although there is no particular limitation on the ratio of the average bonding width to the average actual length, the ratio thereof is preferably 0.5 or less. Accordingly, the anchor portions 216 can protrude sharply, thus further increasing the anchoring force of the anchor portions 216 to the base member 210.

The anchor portions 216 are constituted by a ceramic material. Although examples of the ceramic material constituting the anchor portions 216 include $Cr_2O_3$ (chromium oxide), $Al_2O_3$ (alumina), $TiO_2$ (titania), CaO (calcium oxide), $SiO_2$ (silica), MnO (manganese oxide), and $MnCr_2O_4$ (manganese chromium spinel), the examples thereof are not limited thereto.

Oxides of an element whose equilibrium oxygen pressure is lower than that of Cr (chromium) (referred to as a "low-equilibrium oxygen pressure element" hereinafter) are suitable as the ceramic material constituting the anchor portions 216. Because the low-equilibrium oxygen pressure element is an element that has a greater affinity for oxygen than Cr and is more likely to be oxidized, it is possible to inhibit oxidation of the base member 210 that surrounds the anchor portions 216 as a result of the anchor portions 216 preferentially taking oxygen that permeates the chromium oxide layer 211. This makes it possible to maintain the forms of the anchor portions 216, and thus to obtain the anchor effect resulting from the anchor portions 216 for a long period of time. As a result, it is possible to inhibit the separation of the chromium oxide layer 211 from the base member 210.

Although examples of the low-equilibrium oxygen pressure element include Al (aluminum), Ti (titanium), Ca (calcium), Si (silicon), and Mn (manganese) and examples of oxides thereof include $Al_2O_3$, $TiO_2$, CaO, $SiO_2$, MnO, and $MnCr_2O_4$, examples thereof are not limited thereto.

The anchor portion 216 may contain only one type of oxide of a low-equilibrium oxygen pressure element, or may contain two or more types thereof. The anchor portion 216 may be constituted by $Al_2O_3$, a mixture of $Al_2O_3$ and $TiO_2$, or a mixture of $TiO_2$, MnO, and $MnCr_2O_4$, for example.

It is preferable that the average content of the low-equilibrium oxygen pressure elements in the plurality of anchor portions 216 is 0.05 or more in terms of a cation ratio when a molar ratio of the elements to the sum of all constituent elements excluding oxygen is defined as the cation ratio. This makes it possible to further inhibit the oxidation of the base member 210 that surrounds the anchor portions 216, and thus to obtain the anchor effect resulting from the anchor portions 216 for a long period of time.

There is no particular limitation on the upper limit of the average content of the low-equilibrium oxygen pressure elements in the plurality of anchor portions 216, and a larger upper limit is more preferable.

The average content of the low-equilibrium oxygen pressure elements in the plurality of anchor portions 216 can be obtained using the following method. First, with each of the twenty anchor portions 216 selected in order to obtain the above-described average vertical length, the contents of low-equilibrium oxygen pressure elements are measured in terms of the cation ratios at ten points at which the actual length L1 is divided into eleven portions. Then, with regard to each anchor portion 216, the maximum value is selected from the contents measured at the ten points. Then, the average content of the low-equilibrium oxygen pressure elements is obtained by arithmetically averaging the twenty maximum values selected for the twenty anchor portions 216.

The anchor portion 216 is preferably in contact with at least a portion of the inner surface of the recess 210b. It is particularly preferable that the recess 210b is entirely filled with the anchor portion 216, and the anchor portion 216 is in contact with substantially the entire inner surface of the recess 210b.

Although there is no particular limitation on the number of anchor portions 216, ten or more anchor portions 216 are preferably observed in a 10 mm length of the surface 210a in the observation of a cross-section of the base member 210, and twenty or more anchor portions 216 are more preferably observed in a 10 mm length thereof. Accordingly, the anchor effect resulting from the anchor portions 216 can be evenly exerted in a wide range, thus particularly inhibiting the separation of the chromium oxide layer 211 from the base member 210.

Method for Manufacturing Alloy Member 400

A method for manufacturing an alloy member 400 will be described.

First, a plurality of recesses 210b are formed in the surface 210a of the base member 210. It is possible to efficiently form the recesses 210b using shot peening, sand blasting, or wet blasting, for example. At this time, the depth and the width of the recesses 210b are adjusted by adjusting the particle size of a polishing agent. Accordingly, it is possible to adjust the average actual length, the average straight line length, the average vertical length, and the average bonding width of the plurality of anchor portions 216 to be formed later. Also, the recesses 210b are curved or bent entirely or partially by leveling the surface thereof using a roller after the recesses 210b are formed. This makes it possible to warp at least some of the anchor portions 216 to be formed later.

Then, by applying, onto the surface 210a of the base member 210, a paste for an anchor portion obtained by adding ethyl cellulose and terpineol to oxides of the low-equilibrium oxygen pressure elements, the recesses 210b are filled with the paste for an anchor portion.

Then, the paste for an anchor portion applied onto the surface 210a of the base member 210 is removed using a squeegee, for example.

Then, as a result of performing heat treatment (800° C. to 900° C., 1 to 20 hours) on the base member 210 in an atmosphere, the paste for an anchor portion with which the recesses 210b are filled is solidified to form the anchor portions 216, and the chromium oxide layer 211 for covering the anchor portions 216 is formed.

Other Embodiments

Although embodiments of the present invention have been described above, the present invention is not limited thereto, and various modifications can be made without departing from the gist of the present invention.

Although the base member 210 includes the recesses 210b and the chromium oxide layer 211 includes the embedded portions 211b in the above-described first embodiment, the chromium oxide layer 211 may include the recesses 210b and the base member 210 may include the embedded portions 211b, for example. It is possible to effectively inhibit the separation of the chromium oxide layer 211 even in this case.

What is claimed is:
1. An alloy member configured to be used in an electrochemical cell stack, the alloy member comprising:
    a base member containing an alloy material containing chromium as a major element;
    a chromium oxide layer covering at least a portion of a surface of the base member;
    a plurality of pores formed in the base member and located within 30 μm from an interface between the chromium oxide layer and the base member, the pores configured to inhibit separation of the chromium oxide layer from the base member; and
    extending portions containing an oxide of an element, the element having an equilibrium oxygen pressure lower than the equilibrium oxygen pressure of the major element of the alloy material, wherein
    the chromium oxide layer covering the base member is formed in a manner where the chromium oxide layer does not extend into the pores in the base member,
    a tip end of each extending portion is exposed to empty interior space in one of the pores, and
    a portion of each extending portion other than the tip end is embedded in the base member.

2. The alloy member according to claim 1, comprising a metal oxide disposed on an inner surface of the pore.

* * * * *